(12) United States Patent
Bocskai et al.

(10) Patent No.: US 12,362,685 B2
(45) Date of Patent: Jul. 15, 2025

(54) DEVICE AND METHOD FOR EFFECTING ROTATIONAL ACTUATION

(71) Applicant: PHYSIK INSTRUMENTE (PI) GMBH & CO. KG, Karlsruhe (DE)

(72) Inventors: Dominik Bocskai, Iffezheim (DE); Harry Marth, Waldbronn (DE)

(73) Assignee: PHYSIK INSTRUMENTE (PI) GMBH & CO. KG, Karlsruhe (DE)

( * ) Notice: Subject to any disclaimer, the term of this patent is extended or adjusted under 35 U.S.C. 154(b) by 604 days.

(21) Appl. No.: 17/765,823

(22) PCT Filed: Oct. 2, 2020

(86) PCT No.: PCT/DE2020/100854
§ 371 (c)(1),
(2) Date: Oct. 11, 2022

(87) PCT Pub. No.: WO2021/063454
PCT Pub. Date: Apr. 8, 2021

(65) Prior Publication Data
US 2023/0063046 A1 Mar. 2, 2023

(30) Foreign Application Priority Data
Oct. 2, 2019 (DE) ............ 10 2019 126 702.1

(51) Int. Cl.
*H02N 2/10* (2006.01)
*H02N 2/00* (2006.01)
*H10N 30/00* (2023.01)

(52) U.S. Cl.
CPC ........... *H02N 2/103* (2013.01); *H02N 2/0025* (2013.01); *H10N 30/702* (2024.05)

(58) Field of Classification Search
CPC .... H02N 2/103; H02N 2/0025; H10N 30/702; Y10S 310/80
See application file for complete search history.

(56) References Cited

U.S. PATENT DOCUMENTS

| 4,613,782 A | 9/1986 | Mori et al. |
| 7,148,605 B2 | 12/2006 | Biegelsen et al. |

(Continued)

FOREIGN PATENT DOCUMENTS

| DE | 69333691 T2 | 12/2005 |
| JP | S63171176 A | 7/1988 |

(Continued)

OTHER PUBLICATIONS

International Search Report and Written Opinion with regard to PCT/DE2020/100854 mailed Dec. 18, 2020.

(Continued)

*Primary Examiner* — Emily P Pham
(74) *Attorney, Agent, or Firm* — The Juhasz Law Firm

(57) ABSTRACT

The invention relates to a rotation actuating device, comprising a base, a rotor and at least two groups of drive units, each group comprising at least two drive units, wherein the drive units are arranged peripherally on the base and between the base and the rotor, wherein each drive unit comprises two deflectable actuators, which are arranged in a V-shape with respect to each other, and a friction element, which is connected to both actuators, and wherein the rotor and the friction elements are pressed in a direction toward each other by means of a spring device arranged between the drive units, such that, when the actuators are not deflected, all the friction elements are in contact with the rotor and jointly span a contact plane, wherein a continuous movement of the rotor is realized by means of phase-offset control of the actuators of different groups of drive units. The invention further relates to a method for operating the rotation actuating device.

10 Claims, 5 Drawing Sheets

(56) References Cited

U.S. PATENT DOCUMENTS

2004/0178699 A1   9/2004   Nakanishi
2007/0182281 A1   8/2007   Mori

FOREIGN PATENT DOCUMENTS

| JP | H103212174 A | 9/1991 |
|----|---|---|
| JP | H11332263 A | 11/1999 |
| JP | 2004222453 A | 8/2004 |
| JP | 2005124263 A | 5/2005 |
| JP | 2010226895 A | 10/2010 |
| JP | 2012080611 A | 4/2012 |
| JP | 2012078391 A | 3/2018 |
| KR | 10-2010-0068672 | 6/2010 |
| KR | 10-2013-0136876 | 12/2013 |
| KR | 10-2018-0122423 | 11/2018 |
| WO | 2017158017 A1 | 9/2017 |

OTHER PUBLICATIONS

English Abstract for DE69333691 retrieved on Espacenet on Mar. 31, 2022.
English Abstract for JP2010226895 retrieved on Espacenet on Mar. 31, 2022.
KR language Notice of Preliminary Rejection, Office Action in Counterpart KR application, Oct. 30, 2023.
ENG translation of KR language Notice of Preliminary Rejection, Office Action in Counterpart KR application, Oct. 30, 2023.
English Abstract of KR 10-2018-0122423 prior art.
English Abstract of KR 10-2013-0136876 prior art.
English Abstract of KR 10-2010-0068672 prior art.
JP Notification of Reasons for Rejection, Mar. 14, 2023 (3 pages).

DEVICE AND METHOD FOR EFFECTING ROTATIONAL ACTUATION

RELATED APPLICATION

This application is a National Stage Entry of PCT/DE2020/100854, filed Oct. 2, 2020, which claims foreign priority to German application No. DE10 2019 126 702.1, filed Oct. 2, 2019; the disclosure of both which are also incorporated herein by reference for all purposes.

BACKGROUND

The invention relates to a rotation actuating device according to claim 1. The invention also relates to a method for operating such a rotation actuating device according to claim 9.

The WO2017/158017 A1 of the applicant describes, in FIG. 7 there, a rotation actuating device using a piezoelectric walk drive 1 having a drive device 2, in which, with reference to FIG. 2 of this publication, four piezoelectric actuators 213, 214, 223, 224 are inserted in pairs in a V-shaped arrangement in a frame 20. Each pair of the actuators arranged in a V-shape with respect to one another is pressed against solid-state joints 212, 222 of the base 201 by means of an associated drive section 21, 22 and an elastic spring section 211, 221 which is arranged between the drive section and the base 201 of the frame 20, as a result of which in particular a prestressing force is realized on the actuators.

By arranging the drive device 2 on a base frame 4 with elastically deformable sections in the form of solid-state joints (not shown in FIG. 7 of WO2017/158017 A1), the drive sections are pressed against the rotor 3 in the form of a circular disk; on the other hand, the elastic properties of the frame allow that, in case of a control of when a cooperating actor pair and the corresponding movement of the drive section coupled thereto, the drive section of the other interacting actor pair either lifts off the rotor exclusively passively, i.e. without electrical actuation and only due to the mechanical arrangement or conditions, or additionally actively, i.e. by appropriate electrical actuation of the respective actor pair, which supports or improves the lifting of this drive section from the rotor.

A disadvantage of the rotation actuating device disclosed in accordance with FIG. 7 of WO 2017/158017 A1 is its comparatively large space requirement, in particular when a plurality of drive devices 2 arranged around the outer circumference of the rotor are used.

In order to solve the aforementioned problem, according to FIG. 5 of the present application, which is not the subject matter of the invention, it would be possible, for example, to arrange three drive devices according to WO 2017/158017 A1 on the inner circumference of a rotor designed as an annular disk, wherein the use of only one drive device or of two or more than three drive devices is also possible in this regard. On the basis of this type of arrangement of the drive device or drive devices, which additionally favour the passive lifting of the drive section of the non-driven actor pair of a drive device, a relatively small rotation actuating device with a small adjustment surface could be realized. However, a disadvantage would be the comparatively complex production of the rotor or the machining of the inner circumferential surface, since this must be produced for a drive very precisely with high precision and while maintaining low tolerances. In addition, with such a solution, a high effort with respect to the orientation of the rotor or the axis of rotation thereof is necessary.

U.S. Pat. No. 4,613,782 discloses, in FIGS. 3 and 4 thereof, a rotation actuating device comprising three drive units, each comprising two piezoelectric actuators 1 and 2, which are arranged in a V-shape relative to one another, which are supported with one of their end sections on a common base 17 and which are coupled at the opposite end sections by means of a movement mechanism 18, wherein the movement mechanism 18 comprises a drive element 10 which is pressed against the movement mechanism 18 by means of a screw connected to the base 17 and wherein a compressive force or prestressing force is exerted on the actuators 1 and 2 as a result of the movement mechanism.

The three drive units are arranged uniformly to a circumference of the driven element 11 realized as an annular disk, so that the three drive elements 10 have a circumferential angular distance of approximately 120° with respect to one another. Since these are arranged between a base and the driven element, the outer dimensions of the rotation actuating device are substantially defined by the fixed wall 20 or the housing 28.

In operation, the actuators of the drive units are electrically controlled in such a way that the drive elements 10 coupled to the actuators perform high-frequency vibrations with an elliptical movement path, wherein the frequency of these oscillations according to column 9, line 13 of U.S. Pat. No. 4,613,782 is 20 kHz, that is to say in the ultrasonic range. All three drive units are acted upon by the same high-frequency voltage signal so that they operate synchronously.

The synchronous control of the three drive units results in temporal phases in which none of the three drive units have contact with the driven element 11, so that an interruption of the drive takes place in these phases. The temporal phases of the interruption of the drive are at high control frequencies of the actuators of the drive units, i.e., at high rotational speeds of the driven element, only very short and can be acceptable in this speed regime. However, the lower the control frequencies or lower the rotational speeds, the more the drive interruptions become noticeable, and therefore the rotation actuating devices known from U.S. Pat. No. 4,613,782 are excluded from certain applications.

On the basis of this background the aim of the invention is to provide a rotation actuating device which allows highly precise and uninterrupted adjusting movements with compact dimensions.

This object is achieved by a rotation actuating device according to claim 1. The same comprises at least four drive units which are arranged on a base in a circumferential manner between the base and a rotor are arranged. The drive units can be assigned to a first and a second group, so that each of the two groups comprises at least two drive units. It is within the meaning of the invention that each of the groups comprises more than two drive units, wherein preferably each group comprises three drive units.

Each of the drive units comprises two actuators which are arranged in a V-shape with respect to one another, wherein the region of the tip of the V thus formed is realized by a friction element which connects or couples the two actuators to one another. The tip of the V and thus the friction element face the rotor of the rotation actuating device.

The angle enclosed between the two actuators of a drive unit due to the V-shaped arrangement can vary within a wide range. Angles between 10° and 160° are possible. Preferably, however, an angular range between 55° and 125° is preferred, wherein the angular range is 85° to 95° particularly preferred.

The friction elements of the drive units and the rotor are pressed towards one another in a direction by means of a spring device arranged centrally and between the drive units in such a way that all the friction elements are in contact with the rotor in a non-actuated or undeflected state of the actuators. In this case, the corresponding contact points or contact surfaces jointly span a contact plane K. The central arrangement of the spring device, in which the drive units surround the spring device in a circumferential manner, enables a particularly compact construction of the rotary adjusting device.

It can be advantageous for the spring device to be formed in one piece with the rotor. As a result of an one-piece or integral realization of the spring device with the rotor, a simpler structure of the rotation actuating device with improved assembly properties is achieved. In this case, it can be of particular advantage that the spring device comprises slit-shaped recesses, by means of which the spring action of the spring device is achieved.

In addition, it can be advantageous that the actuators are supported on the base in each case on a supporting section which is connected to the base via a joint or joint section. The support section and the joint or joint section are preferably formed in one piece or integrally with the base. Due to the support of support sections arranged in an articulated manner a loading of the actuators with transverse forces can be counteracted. In addition, by this means mechanical tolerances which result from production or assembly can be compensated.

In addition, it can be advantageous that the actuators have an electromechanical material and preferably consist thereof. An electromechanical material performs a mechanical deformation when an electrical voltage is applied and a corresponding electric field is realized, said mechanical deformation being usable for actuating or driving movements. Actuators made of an electromechanical material have no mechanical components and can convert electrical energy very efficiently and with very high dynamics into a mechanical deformation or movement. It is also conceivable that the actuators comprise or consist of a material having electrostrictive properties.

The actuators preferably consist of a piezoelectric material and particularly preferably of a piezoceramic material. Piezoelectric or piezoceramic materials are readily available and can be operated in a very defined manner. It is also conceivable that the actuators have a material with electrostrictive properties.

The invention also relates to a method for operating a rotation actuating device described above, in which different groups of drive units are controlled in a phase-shifted manner with respect to one another. For example, in case of a rotation actuating device which comprises two groups of drive units, the drive units of a first group are controlled in a phase-shifted manner with respect to the drive units of the corresponding second group.

In this case, it can be advantageous that the control of the respective group of drive units takes place in such a way that a defined movement path of the friction elements assigned to these drive units results, which comprises a vertical movement component arranged substantially perpendicular to the contact plane K and a horizontal movement component arranged substantially parallel to the contact plane K, and that the result occurs that, due to the vertical movement component which acts against the force of the spring device, the friction elements of the actuators of the respective other group of drive units are brought out of contact with the rotor and that, due to the vertical movement component a defined drive step of the rotor in the drive direction is generated.

DESCRIPTION OF THE DRAWINGS

The following is a description of an embodiment of the rotation actuating device according to the invention with regard to the corresponding figures, wherein the same reference signs relate to identical parts of the different figures.

DETAILED DESCRIPTION

Figure 1:
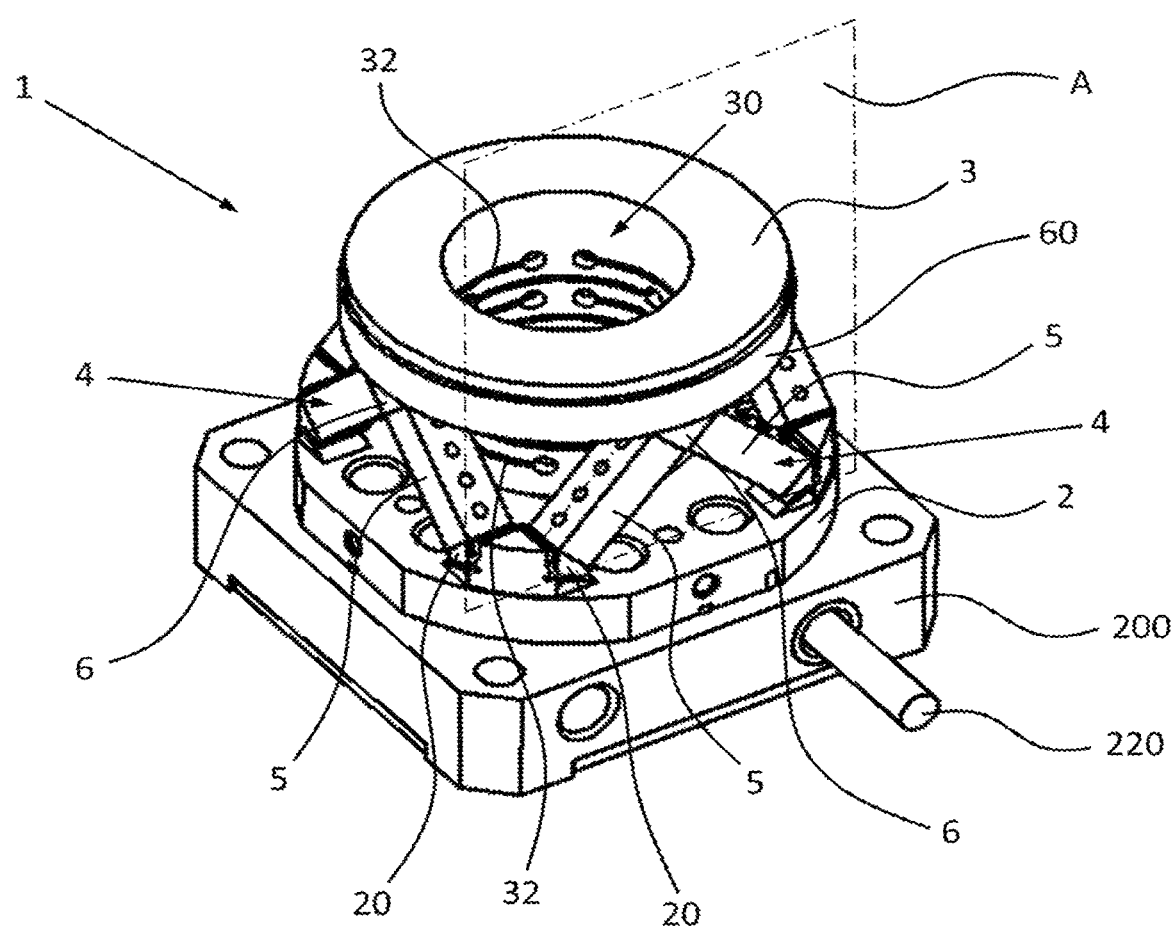
FIG. 1: perspective view of a rotation actuating device according to the invention

FIG. 1 shows a rotary adjusting device 1 according to the invention in a perspective representation. On a substantially ring-shaped base 2 made of stainless steel, which is connected to a socle 200, a total of four drive units 4 are arranged in a circumferential manner and substantially 90° relative to one another in such a way that the same lie diametrically opposite one another in pairs and in overlapping relation to one another.

Each drive unit 4 is formed by two elongated piezoelectric actuators 5, which are arranged relative to one another in such a way that they commonly essentially form a V-shape, wherein the ends of the two actuators 5 of a drive unit 4 pointing away from the base 2 are connected or coupled to one another via a substantially triangular friction element 6. The respective other end of each actor 5 of a drive unit 4, which points towards the base 2, is supported on a support section 20 which is connected to the base 2 via a solid-state joint. The support section 20 and the solid-state joint are formed in one piece or integrally with the base 2.

The central planes of the two actuators 5, which are assigned to a drive unit 4 and are arranged in a V-shape relative to one another, span a plane which defines a drive unit center plane A, wherein the drive unit center planes A of the drive units 4 arranged diametrically opposite one another lie substantially parallel to one another, and wherein the drive unit center planes A of adjacent drive units 4 are arranged substantially perpendicular to one another.

The column-shaped piezoelectric actuators consist of a piezoceramic material. The same are each connected both to the associated joint 20 and to the associated friction element 6 in a materially bonded manner, in particular by adhesive bonding. The two actuators 5 which are associated with a drive unit 4 enclose between them an angle of approximately 90°.

In the rest state of the rotation actuating device shown in FIG. 1, in which none of the actuators 5 of the four drive units 4 is electrically actuated or subjected to an electrical voltage, all four friction elements 6 are in contact with an annular friction disc 60 which is connected to a rotor 3 in a material-bonded manner.

The friction disc 60 is arranged substantially parallel to the base 2 and spaced apart therefrom, the drive units 4 being located between the base 2 and the friction disc 60. This contact points or contact surfaces of the friction elements 6 with the friction disc 60 lie substantially in a contact plane K (see FIG. 3B), wherein the drive unit centre planes A are arranged substantially perpendicular to the contact plane K.

The socle 200 serves to receive the cables leading to the actuators 5 of the drive units 4, by means of which the electrical voltage supply of the actuators 5 is ensured. These inner cables are connected to the supply line 220. The socle 200 is also used to mount the rotation actuating device on a higher-level unit. It is conceivable to integrate electronic components into the socle 200 for controlling the rotation actuating device 1, such as sensors, receivers, controllers, drivers, etc. In addition, it is conceivable to provide a battery or an accumulator for the independent energetic supply of the rotation actuating device in the socle 200.

The rotor 3 is mounted rotatably relative to the fixed base 2. A spring device 30 is formed integrally or in one piece with the rotor on its inner circumference, wherein the spring device 30 is arranged centrally and between the drive units 4, so that the drive units 4 surround or frame the spring device 30 in a circumferential manner. The resilient action of the spring device 30 is realized by slit-shaped recesses 32 which point in the circumferential direction of the rotor 3 and are spaced apart in the axial direction of the rotor 3. The spring device 30 of the rotor 3 causes the rotor 3 or the friction disc 60 to be pressed elastically against all the friction elements 6 of the drive units 4.

Figure 2:
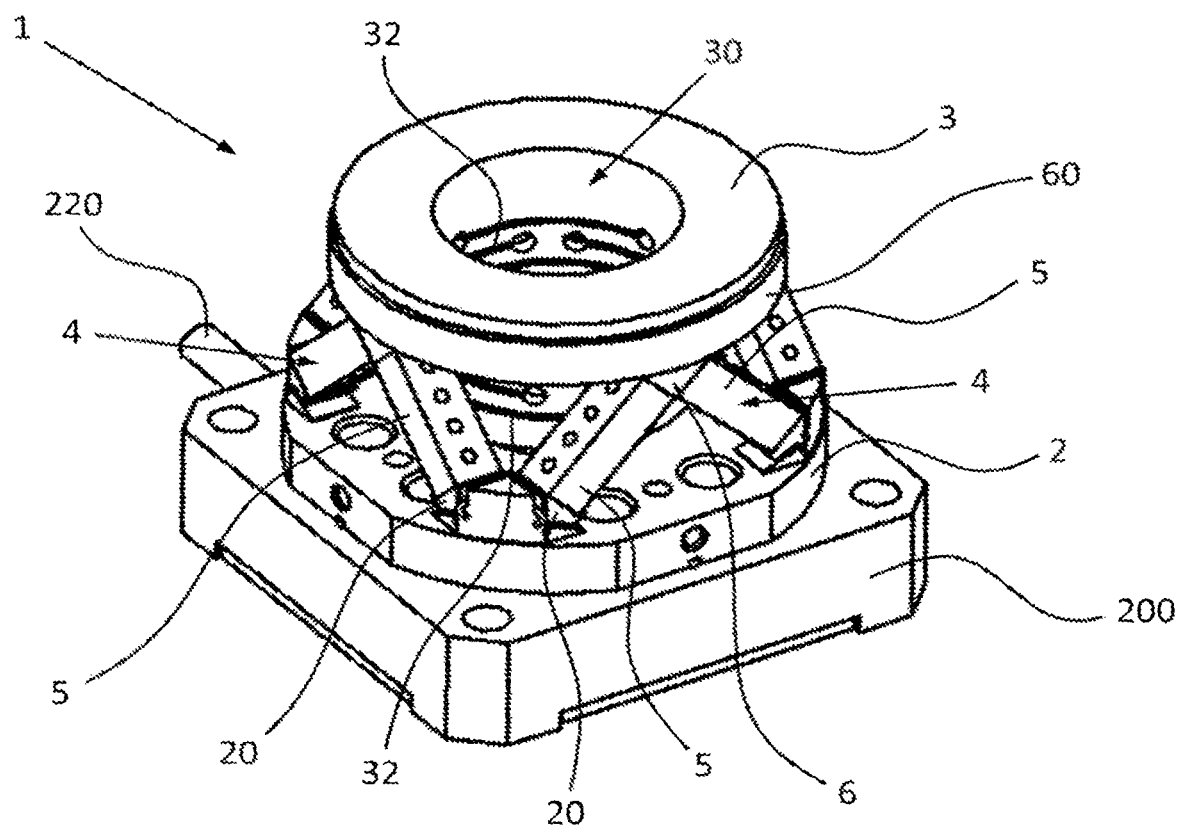
FIG. 2: perspective view of the rotary adjusting device according to FIG. 1 in a different view

FIG. 2 shows the rotational setting device 1 according to FIG. 1 in a different view, wherein the rear side covered in FIG. 1 can be seen here and therefore the drive unit 4 arranged there and not visible in FIG. 1 can be seen. Since otherwise no features can be seen in FIG. 2, which cannot already be seen in FIG. 1, a more detailed description of FIG. 2 is omitted at this point.

Figure 3A:
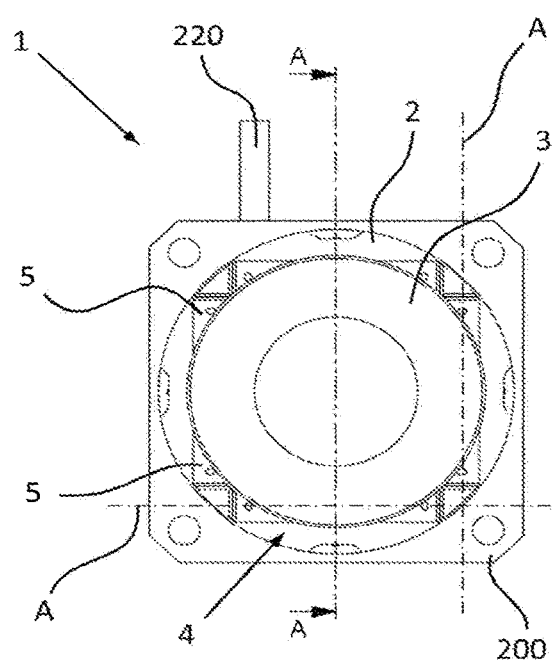
FIGS. 3A and 3B: plan view and sectional representation with respect to the rotation actuating device according to FIG. 1 or FIG. 2
Figure 3B:
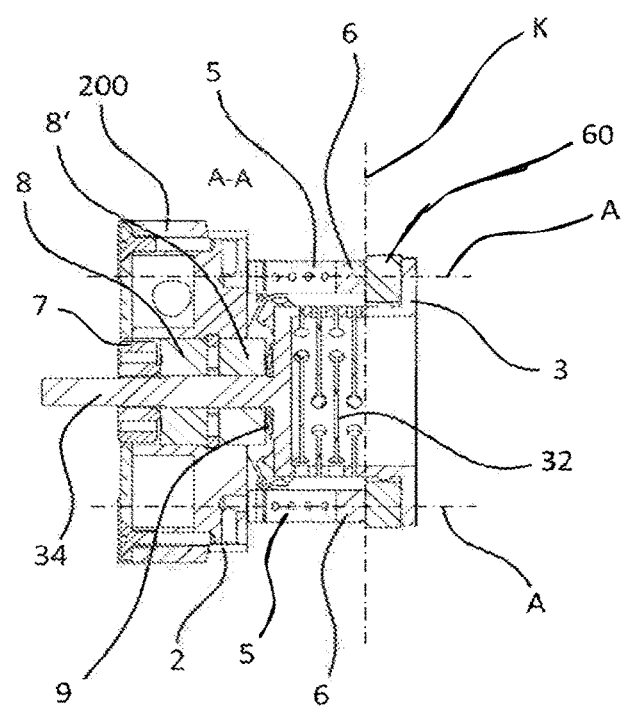

FIG. 3A shows the rotation actuating device according to the invention according to FIG. 1 or FIG. 2 in a plan view (viewing direction perpendicular to the base 2 or rotor 3), while FIG. 3B relates to the section marked in FIG. 3A. In the sectional view according to FIG. 3B, it can be clearly seen that, in the rest state shown here, in which there is no electrical control of the actuators of the drive units, the two recognizable friction elements 6 are in contact with the friction disc 60, and this also applies to the two further friction elements 6 which cannot be seen in FIG. 3B. The resulting four contact points or contact surfaces between the friction elements 6 and the friction disc 60 lie substantially in a plane which defines the contact plane K. The drive unit center planes A are arranged substantially perpendicular to the contact plane K, wherein the drive unit center planes A of diametrically opposite drive units 4 are arranged substantially parallel to one another.

Furthermore, it can be seen from FIG. 3B that a shaft 34 is formed in one piece with the rotor 3 and projects both through the base 2 and through the socle 200 and projects with respect to the surface of the socle 200, so that an element to be positioned by the rotation adjusting device 1 can be attached or can be connected to the projecting portion of the shaft 34.

In order to adjust the spring force with which the rotor 3 or the friction disc 60 is elastically pressed against the friction elements 6 of the drive units 4, a clamping nut 7 acts on a corresponding threaded section of the shaft 34 and is supported on a bearing 8. By rotating the clamping nut 7 onto the threaded section of the shaft 34, the shaft 34 and thus the rotor 3 are moved in the direction of the clamping nut 7 (in FIG. 3B is thus pulled to the left), so that the friction disc 60 connected thereto is pressed elastically against the friction elements 6 of the drive units 4 via the rotor 3.

The bearing 8 is an angular ball bearing which is prestressed by the clamping nut 7 screwed onto the threaded section of the shaft 34. A second angular ball bearing 8' is separated from the first angular contact ball bearing 8 by a snap ring and is prestressed by a plate spring 9 provided between the rotor 3 and the latter.

Figure 4A:
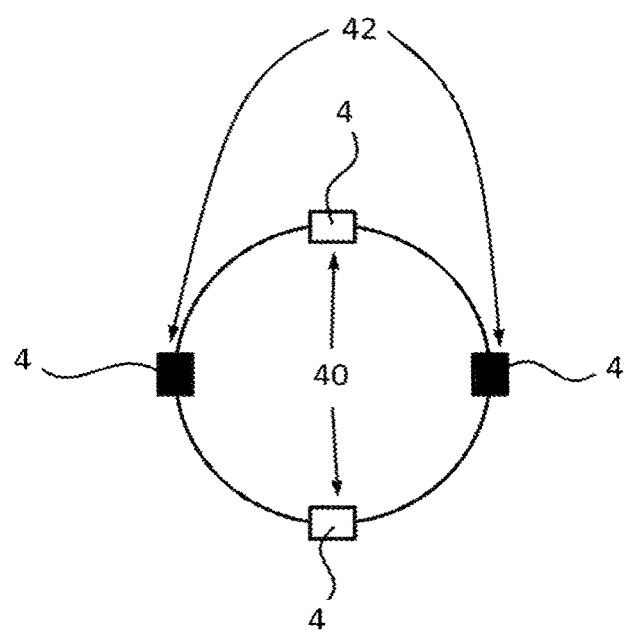
FIGS. 4A and 4B: schematic representation relating to the groups of drive units of the rotation actuating device according to the invention
Figure 4B:
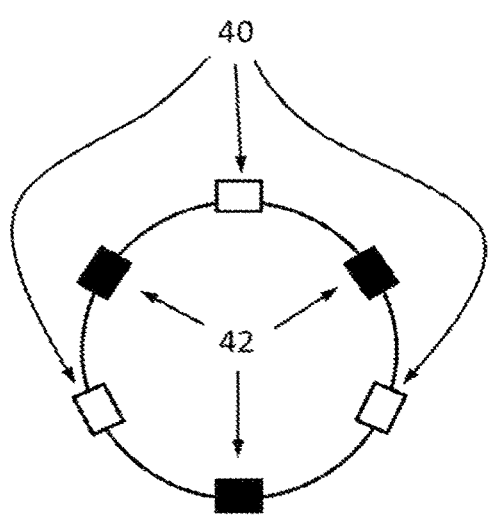
Figure 5:
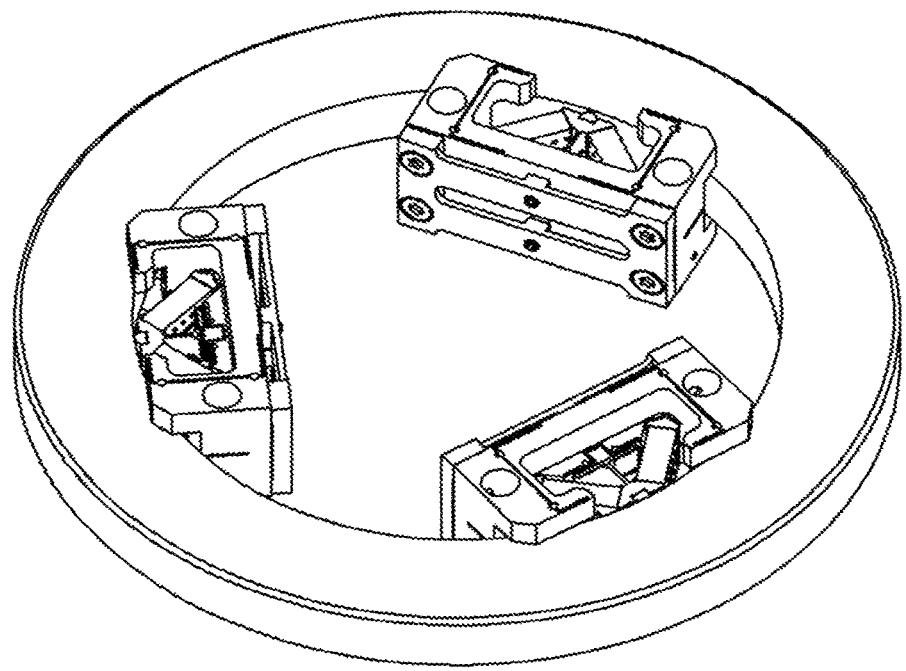
FIG. 5: perspective representation of a rotation actuating device which does not belong to the invention

FIGS. 4A and 4B schematically illustrate two possible arrangement variants with respect to the drive units 4. FIG. 4A here corresponds to the arrangement of drive units 4 according to the exemplary embodiment for a rotation actuating device according to the invention according to FIGS. 1 to 3, wherein four drive units 4 are arranged along a circumference with a respective angular distance from one another of substantially 90°. In this way, two drive units are arranged diametrically opposite each other, wherein the corresponding pair of drive units 4 can be assigned to a group. In FIG. 4A, the pair of drive units 4, which is characterized by an unfilled frame, forms a first group 40 of drive units 4, while the other pair of drive units 4, which is characterized by a filled frame, forms a second group 42 of drive units 4.

In a method according to the invention for operating a corresponding rotation actuating device according to FIGS. 1 to 3, the two groups 40 and 42 of drive units 4 or actuators 5 thereof are electrically controlled in a phase-shifted manner, preferably by a phase offset of 180°. In the respective drive unit 4, the control signals preferably lead to an elliptical movement path of the friction element 6 assigned to the drive unit 4, wherein the friction elements 6 of the drive units 4 assigned to a group 40, 42 perform a simultaneous movement path. In this way, for example, the group 40 of drive units initially effects a defined rotational advance or adjustment movement step of the rotor 3, and immediately subsequently, i.e., after the drive units 4 of the group 40 have completed their advance step, the group 42 of drive units 4 effects such an advance or adjusting movement step. The groups 40, 42 of drive units 4 thus alternately perform a defined advance step, wherein a certain overlap in the drive movements is also possible in this case, i.e., that a group of drive units already starts the next advance step, while the other group of drive units has not yet completely completed its feed step.

Due to the shape of the movement path of the friction elements 6 of the drive units 4, which is preferably elliptical and thus comprises both horizontal movement components substantially parallel to the contact plane K and vertical movement components substantially perpendicular to the contact plane K and substantially parallel to the drive unit center planes A, the drive movement of a group 40, 42 of drive units 4 effects or the vertical movement components of the respective friction element 6 effect a force on the spring device 30 of the rotor 3, which counteracts the spring force exerted by said spring device, wherein the spring force ensures a movement of the rotor 3 or friction disc 60 in the direction of the friction elements 6, whereby the effect results that, in a purely mechanical or passive manner, the friction elements 6 of the respective other group of drive units 4, which are not used for propulsion, are lifted or brought out of contact. It is thus ensured that, during an advance step—implemented by a group of drive units 4 or by means of the horizontal components of the movement paths of the friction elements assigned to them—the friction elements of the drive units 4 of the respective other group do not impede this advance step by their contact with the friction disc 60 of the rotor 3.

It can be advantageous that the previously described process of mechanically caused lifting of the friction elements of a group of drive units is supported by a corresponding electrical actuation of the actuators of this group of drive units, in which the same experiences a certain length reduction.

According to FIG. 4B, it is conceivable that a group 40, 42 of drive units comprises three drive units 4, wherein the total of six drive units are arranged along a circumference of the circle, wherein an angular distance of approximately 60° exists between adjacent drive units. In this case, a drive unit of a group is always arranged between two drive units of the other group, so that the drive units of a group assume an angular distance of approximately 120° with respect to one another. The specific advantage when using two groups of drive units for each three drive units results from an improved mechanically caused lifting of the friction elements of the drive units which are not used for propulsion for the advance during the advance step which is caused by the drive units of the other group.

In addition to the two arrangements of the drive units shown in FIGS. 4A and 4B, further configurations are possible in which each of the two groups of drive units comprises more than three drive units. The provision of more than two groups of drive units is also conceivable, wherein the drive units of the individual groups are phase-shifted with respect to one another. For example, the six drive units of the configuration according to FIG. 4B can be assigned three groups of diametrically opposite drive units, and the three groups of drive units can be controlled in a circumferential manner.

LIST OF REFERENCE SIGNS

1: Rotation actuating device
2: Basis
3: Rotor
4: Drive unit
5: actor (of the drive unit 4)
6: Friction element (the drive unit 4)
7: Clamping nut
8, 8': Angular ball bearing
9: Disc spring
20: Support section
30: Spring device
32: slit-shaped recesses (of the spring device 30)
34: Shaft (of rotor 3)
40: first group of device units 4
42: second group of device units 4
60: friction disc
200: socle
220: electrical supply line
A: drive unit center plane
K: contact plane

The invention claimed is:

1. A device for effecting rotational actuation, the rotational actuation device including
a base,
a rotor, and
at least two groups of drive units, each of the at least two groups of drive units comprising at least two drive units,
wherein the drive units of each of the at least two groups of drive units are arranged circumferentially on the base, between the base and the rotor, and each of the drive units comprises two deflectable actuators arranged in a V-shape with respect to one another and a friction element which is connected to the two deflectable actuators, and
wherein the rotor and the friction element of each of the drive units are pressed towards each other by means of a spring device which is arranged between the drive units such that, when the two deflectable actuators are not deflected, all the friction elements of each of the drive units are in contact with the rotor and jointly span a contact plane,
wherein a continuous movement of the rotor is realized by means of phase-offset actuation of the two deflectable actuators of different drive units of the at least two groups of drive units.

2. The device for effecting rotational actuation according to claim 1,
wherein the spring device is formed in one piece with the rotor.

3. The device for effecting rotational actuation according to claim 1,
wherein the spring device comprises slit-shaped recesses.

4. The device for effecting rotational actuation according to claim 1,
wherein the two deflectable actuators are each supported on the base via a support section which is connected to the base via a joint.

5. The device for effecting rotational actuation according to claim 1,
wherein the rotor comprises a friction disc which is provided for contact with the friction elements of each of the drive units.

6. The device for effecting rotational actuation according to claim 1,
wherein a shaft is formed in one piece with the rotor and projects through the base, wherein the shaft is provided for attaching an element to be positioned by the rotation adjusting device thereto.

7. The device for effecting rotational actuation according to claim 1,
wherein the two deflectable actuators comprise an electromechanical material and preferably consist thereof.

8. The device for effecting rotational actuation according to claim 7,
wherein the two deflectable actuators consist of piezoelectric and preferably of piezoceramic material.

9. A method for operating the rotation actuating device according to claim 1,
wherein different groups of drive units are actuated in a phase-offset manner with respect to one another.

10. A method for operating the rotation actuating device according to claim 9, comprising the steps of:
actuating the respective group of the at least two groups of drive units to effect a defined movement path of the friction elements of each of the drive units of each of the at least two groups of drive units, the defined movement path comprising a vertical movement component arranged substantially perpendicular to the contact plane and a horizontal movement component arranged substantially parallel to the contact plane;
bringing the friction elements of the two deflectable actuators of the respective other group of drive units out of contact with the rotor by means of the vertical movement component which acts against a force of the spring device; and generating a defined drive step of the rotor in a drive direction by means of the horizontal movement component.

\* \* \* \* \*